(12) United States Patent
Liu

(10) Patent No.: US 10,896,821 B2
(45) Date of Patent: Jan. 19, 2021

(54) ASYMMETRIC WAFER BOW COMPENSATION BY PHYSICAL VAPOR DEPOSITION

(71) Applicant: Lam Research Corporation, Fremont, CA (US)

(72) Inventor: Chanyuan Liu, Portland, OR (US)

(73) Assignee: Lam Research Corporation, Fremont, CA (US)

(*) Notice: Subject to any disclaimer, the term of this patent is extended or adjusted under 35 U.S.C. 154(b) by 211 days.

(21) Appl. No.: 16/147,090

(22) Filed: Sep. 28, 2018

(65) Prior Publication Data

US 2020/0105531 A1 Apr. 2, 2020

(51) Int. Cl.
*H01L 21/302* (2006.01)
*H01L 21/02* (2006.01)
(Continued)

(52) U.S. Cl.
CPC ......... *H01L 21/302* (2013.01); *C23C 14/042* (2013.01); *C23C 14/0617* (2013.01); *C23C 14/0641* (2013.01); *C23C 14/345* (2013.01); *C23C 14/352* (2013.01); *C23C 16/345* (2013.01); *H01L 21/02016* (2013.01); *H01L 21/02164* (2013.01); *H01L 21/02178* (2013.01);
(Continued)

(58) Field of Classification Search
CPC ............ H01L 21/2855; H01L 21/0217; H01L 21/02164; H01L 21/02266; H01L 21/02178; H01L 21/02186; H01L 21/02016; H01L 21/302; H01L 23/562; C23C 14/042; C23C 14/56; C23C 14/352; C23C 14/402; C23C 14/345; C23C 16/303; C23C 16/345; C23C 16/402
See application file for complete search history.

(56) References Cited

U.S. PATENT DOCUMENTS 6,596,133 B1 * 7/2003 Moslehi .............. C23C 14/0031
118/723 MP
7,070,660 B2 7/2006 Keeton et al.
(Continued)

FOREIGN PATENT DOCUMENTS

EP 1050601 A1 11/2000

OTHER PUBLICATIONS

Abdallah et al., "Deposition of AlN films by reactive sputtering: Effective of radio frequency substrate bias" Thin Solid Films, vol. 515, Mar. 12, 2007, pp. 7104-7106.
(Continued)

*Primary Examiner* — Errol V Fernandes
*Assistant Examiner* — Jeremy J Joy
(74) *Attorney, Agent, or Firm* — Weaver Austin Villeneuve & Sampson LLP

(57) ABSTRACT

Methods for reducing warpage of bowed semiconductor substrates, particularly saddle-shaped bowed semiconductor substrates, are provided herein. Methods involve depositing a bow compensation layer by physical vapor deposition on the backside of the bowed semiconductor substrate in regions to form a compressive film on a tensile substrate and a tensile film on a compressive substrate. Methods involve sputtering material onto a backside of a substrate using a shadow mask or by using more than one target and rotating the semiconductor substrate being sputtering operations.

18 Claims, 4 Drawing Sheets

(51) Int. Cl.
*H01L 21/67* (2006.01)
*H01L 23/00* (2006.01)
*C23C 16/34* (2006.01)
*C23C 14/35* (2006.01)
*C23C 14/34* (2006.01)
*C23C 14/06* (2006.01)
*C23C 14/04* (2006.01)

(52) U.S. Cl.
CPC .. *H01L 21/02186* (2013.01); *H01L 21/02266* (2013.01); *H01L 23/562* (2013.01)

(56) References Cited

U.S. PATENT DOCUMENTS

| | | | | |
|---|---|---|---|---|
| 8,440,259 | B2* | 5/2013 | Chiang | C23C 16/45574 427/248.1 |
| 8,728,956 | B2 | 5/2014 | LaVoie et al. | |
| 2004/0124452 | A1* | 7/2004 | Wellhausen | H01L 27/11507 257/295 |
| 2006/0051938 | A1* | 3/2006 | Connell | H01L 23/562 438/460 |
| 2006/0105106 | A1 | 5/2006 | Balseanu et al. | |
| 2006/0220192 | A1* | 10/2006 | Kurachi | H01L 21/3185 257/669 |
| 2010/0261353 | A1* | 10/2010 | Prins | G03F 7/70616 438/703 |
| 2011/0256734 | A1 | 10/2011 | Hausmann et al. | |
| 2014/0295651 | A1* | 10/2014 | Ramdani | H01L 21/02381 438/483 |
| 2014/0374879 | A1* | 12/2014 | Chen | H01L 21/76802 257/532 |
| 2015/0155242 | A1* | 6/2015 | Li | H01L 21/481 257/640 |
| 2015/0340225 | A1* | 11/2015 | Kim | C23C 16/44 438/694 |
| 2016/0203971 | A1 | 7/2016 | Tsiang et al. | |
| 2017/0162522 | A1* | 6/2017 | Chang | C23C 16/402 |
| 2017/0178891 | A1* | 6/2017 | Batinica | H01L 21/02002 |
| 2017/0243836 | A1 | 8/2017 | Chen et al. | |
| 2017/0263466 | A1* | 9/2017 | Ranish | H01L 21/67115 |
| 2018/0068860 | A1* | 3/2018 | deVilliers | H01L 22/20 |
| 2018/0127310 | A1* | 5/2018 | Keech | C03C 23/0075 |
| 2018/0308670 | A1* | 10/2018 | Wilby | H01J 37/3485 |
| 2019/0013250 | A1 | 1/2019 | Miao et al. | |
| 2019/0177155 | A1* | 6/2019 | Qian | B81B 3/0072 |
| 2019/0385954 | A1* | 12/2019 | Rondon | H01L 21/0214 |
| 2020/0075326 | A1* | 3/2020 | Hatazaki | H01L 21/0228 |
| 2020/0098702 | A1* | 3/2020 | Sheng | H01L 21/02274 |
| 2020/0105523 | A1 | 4/2020 | Liu et al. | |

OTHER PUBLICATIONS

Sanchez, D., [*E-Newsletter*] "Coating Materials News" Cerac inc., vol. 20, No. 1, Mar. 2010, pp. 1-4. <URL: http://www.cerac.com>.
Hardy, N., [*Webpage*] "What are Planar Magnetrons in PVD Coatings?" Semicore Equipment, Inc., Apr. 13, 2013, pp. 3. [Retrieved 2018] <URL:http://www.semicore.com/news/66-planar-magnetron-pvd-coating/>.
U.S. Appl. No. 16/147,061, filed Sep. 28, 2018, Liu et al.
Office Action dated Dec. 23, 2019 issued in U.S. Appl. No. 16/147,061.
Notice of Allowance dated Jun. 10, 2020 issued in U.S. Appl. No. 16/147,061.
PCT International Search Report and Written Opinion dated Jun. 18, 2019 issued in PCT/US2018/061684.

* cited by examiner

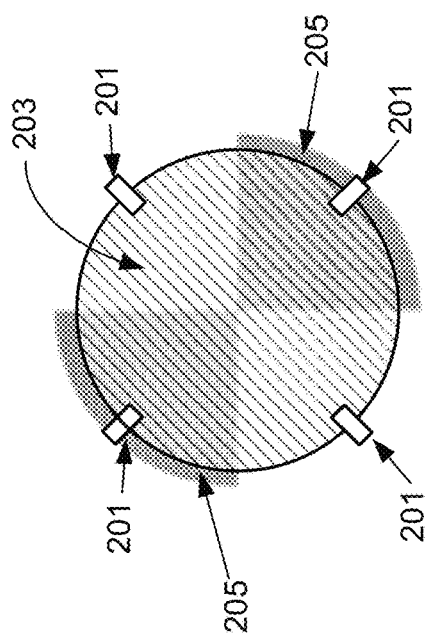
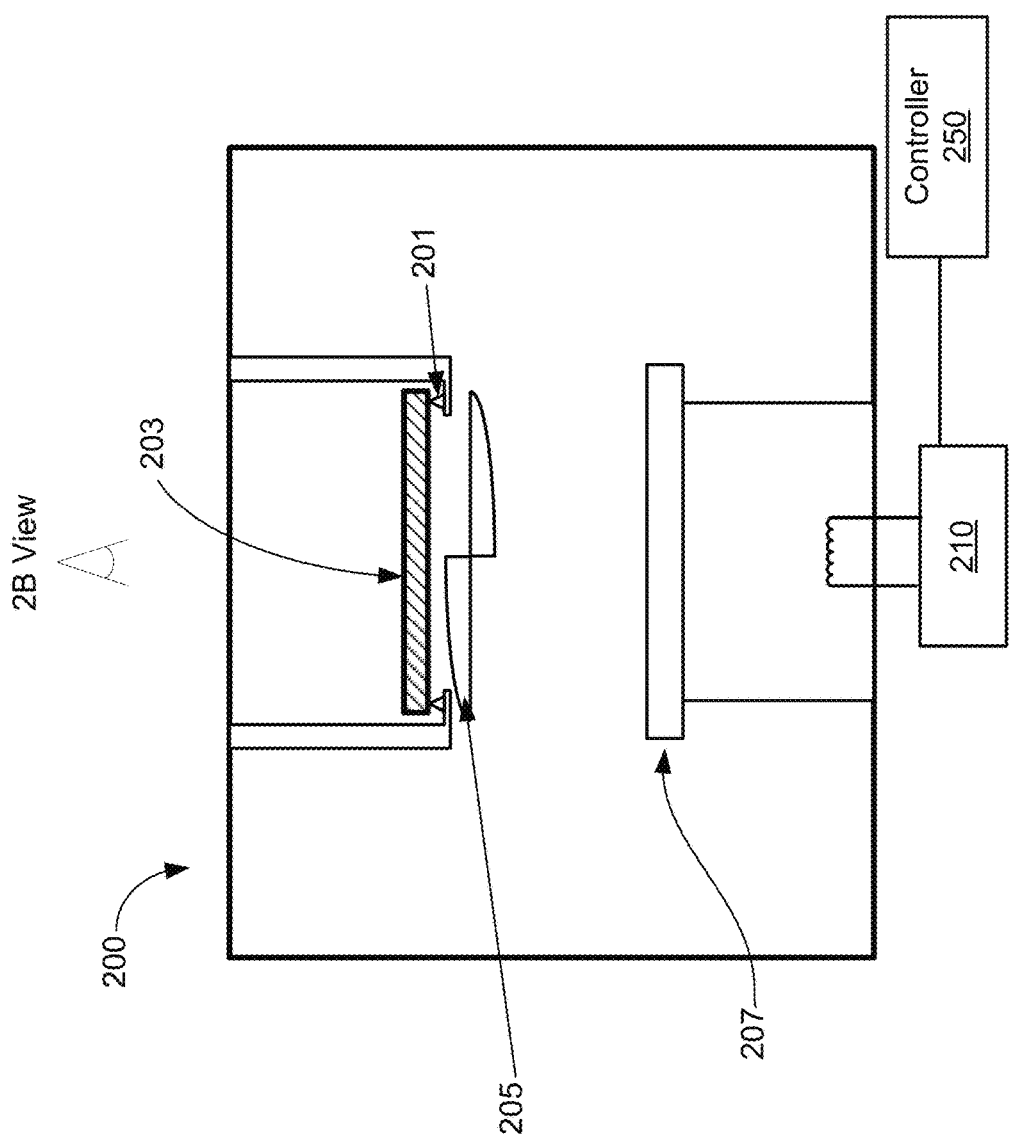

ASYMMETRIC WAFER BOW COMPENSATION BY PHYSICAL VAPOR DEPOSITION

BACKGROUND

Semiconductor manufacturing processes involve many deposition and etching operations, which can change wafer bow drastically. For example, in 3D-NAND fabrication, which is gradually replacing 2D-NAND chips due to lower cost and higher reliability in various applications, multi-stacked films with thick, high stress carbon-based hard masks can cause significant wafer warpage, leading to front side lithographic overlay mismatch, or even wafer bow beyond chucking limit of a electrostatic chuck.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Methods of processing semiconductor substrates are provided. One aspect involves a method including: providing a bowed semiconductor substrate having a first tensile region and a first compressive region; and mitigating bowing of the bowed semiconductor substrate by sputtering a bow compensation layer on the backside of the bowed semiconductor substrate by physical vapor deposition, the bow compensation layer comprising a second tensile region and a second compressive region.

The method may also include prior to mitigating the bowing, aligning the bowed semiconductor substrate such that the first tensile region and the first compressive region is aligned with a target for sputtering the second compressive region and the second tensile region respectively to a backside of the bowed semiconductor substrate.

In various embodiments, the bowed semiconductor substrate after mitigating bowing has a warpage between −500 μm and 500 μm.

In some embodiments, the bowed semiconductor substrate is bowed up to about 500 μm as measured from the lowest point of the bowed semiconductor substrate to the highest point of the bowed semiconductor substrate prior to depositing the bow compensation layer. In some embodiments, the bowed semiconductor substrate is bowed up to about 300 μm as measured from the lowest point of the bowed semiconductor substrate to the highest point of the bowed semiconductor substrate prior to depositing the bow compensation layer.

In various embodiments, the bowed semiconductor substrate is saddle-shaped prior to depositing the bow compensation layer.

In some embodiments, the bowed semiconductor substrate has an x-axis bowing of greater than 200 μm and y-axis bowing greater than 200 μm prior to depositing the bow compensation layer.

In various embodiments, the second tensile region is deposited on the first tensile region of the backside of the bowed semiconductor substrate. The second tensile region may include aluminum nitride deposited using an aluminum-containing target.

In some embodiments, the second compressive region is deposited on the first compressive region of the backside of the bowed semiconductor substrate. The second compressive region may include titanium nitride deposited using a titanium-containing target.

In some embodiments, the second tensile region and second compressive region of the bow compensation layer are on alternating quadrants of the bow compensation layer.

In various embodiments, the bow compensation layer is deposited in two or more separate operations. The two or more separate operations may include an operation for deposition of the second tensile region of the bow compensation layer and an operation for deposition of the second compressive region of the bow compensation layer.

The bow compensation layer may be deposited in two or more separate operations.

In various embodiments, the second compressive region includes carbon. In various embodiments, the second compressive region includes silicon.

In various embodiments, the bow compensation layer includes two or more compositions.

The method may also include flowing a process gas during the mitigating of the bowing of the bowed semiconductor substrate.

In various embodiments, the bow compensation layer comprises aluminum nitride, titanium nitride, or both.

In some embodiments, the bow compensation layer regions deposited in opposite quadrants have different compositions.

These and other aspects are described further below with reference to the drawings.

BRIEF DESCRIPTION OF THE DRAWINGS

FIG. 2A is a schematic diagram of an example process station for performing disclosed embodiments.

FIG. 2B is a top view of the wafer and shadow mask in FIG. 2A.

DETAILED DESCRIPTION

Figure 1:
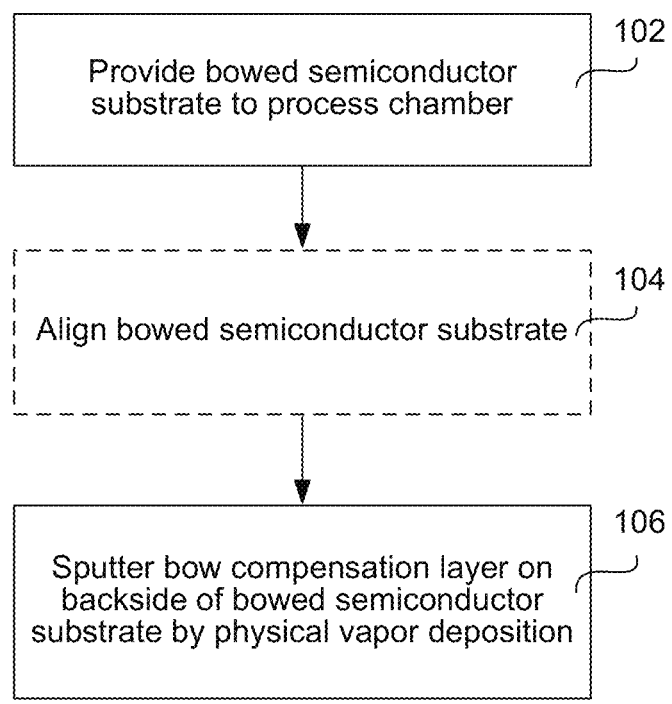
FIG. 1 is a process flow diagram showing operations of a method performed in accordance with certain disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In this application, the terms "wafer" and "substrate" are used interchangeably. One of ordinary skill in the art would understand in many embodiments the methods and apparatus described herein can be used prior to or during processing of a silicon wafer during any of many stages of integrated circuit fabrication thereon. A wafer or substrate used in the semiconductor device industry typically has a diameter of 200 mm, 300 mm, or 450 mm. Other types of reactors that may benefit from the disclosed embodiments include those used to fabricate various articles such as printed circuit boards, displays, and the like. In addition to semiconductor wafers, the methods and apparatus described herein may be used with deposition chambers configured for other types of substrates including glass and plastic panels. Accordingly, where the term "wafer" is used in the description below, it will be understood that the description also applies to a panel or other substrate.

Semiconductor fabrication processes involve formation of various structures, many of which may be two-dimensional. As semiconductor device dimensions shrink and devices are scaled to be smaller, the density of features across a semiconductor substrate increases, resulting in a layers of material etched and deposited in various ways, including in three dimensions. For example, 3D-NAND is one technology that is becoming increasingly popular due to lower cost and increased memory density compared to other techniques, such as 2D-NAND, and higher reliability in various applications. During the fabrication of a 3D-NAND structure, wafer bow can change drastically. For example, etching of trenches along a wafer surface in fabricating a 3D-NAND structure can cause wafer bowing.

As layers of films are stacked on top of each other during fabrication, more stress is introduced to the semiconductor wafer which can cause bowing. Wafer bow is proportional to film stress times the film thickness divided by the square of substrate thickness. In some cases stress does not change with varying thickness but if high stress films are deposited to a large thickness the wafer bow will increase.

Wafer bowing can be measured or evaluated by obtaining a wafer map. Bowing can be measured using an optical technique. Bowing can be quantified using a warpage value measured as the vertical distance between the lowest point of the semiconductor wafer to the highest point on the wafer. In a bow-shaped wafer, the lowest point is the center of the wafer and the highest point is the edge of the wafer. In a dome-shaped wafer, the lowest point is the edge of the wafer and the highest point is the center of the wafer. Bow-shaped and dome-shaped wafers have symmetrical bowing. Wafers can also have asymmetric bowing. In asymmetric bowing, warpage is measured along an x-axis and a y-axis. An asymmetrically bowed wafer has different values for the x-axis warpage and y-axis warpage. In some cases, an asymmetrically bowed wafer has a negative x-axis warpage and a positive y-axis warpage. In some cases, an asymmetrically bowed wafer has a positive x-axis warpage and a negative y-axis warpage. In some cases, an asymmetrically bowed wafer has both a positive x-axis warpage and a positive y-axis warpage, but the warpage values are different. In some cases, an asymmetrically bowed wafer has both a negative x-axis warpage and a negative y-axis warpage, but the warpage values are different. One example of an asymmetrically bowed wafer is a saddle-shaped wafer. For a saddle-shaped wafer, in one example, the warpage on the x-axis may be 200 μm and the warpage on the y-axis may be −200 μm. Saddle-shaped may be referred to as a substrate where two opposing edges of the wafer are curved upward while another two opposing edges of the wafer are curved downward.

Bowing can cause problems with subsequent processing, such as during lithography, as etching can be uneven if the semiconductor substrate is warped. High bowing can be caused by deposition of thick, high stress carbon hard mask layer. Additionally, due to multi-stacked films and the presence of thick, high stress carbon-based hard masks used in such fabrication processes, etching can cause some asymmetric warpage and deposition processes can introduce significant wafer warpage of up to a variation of between ±500 μm to −1300 μm bow. For example, an ashable hard mask may have a stress of up to −1000 MPa and have introduce a bow value of up to −1000 μm. Addressing such wafer warpage can be a challenge as subsequent processing may be affected by a wafer warpage exceeding +500 μm, and can be a particular challenge, especially when wafers are used in subsequent processing involve chucking of the wafer to an electrostatic chuck, as many electrostatic chucks have a "chucking limit," which is defined as the maximum warpage tolerated before the wafer cannot be effectively chucked. Many electrostatic chucks have a chucking limit of about ±300 μm. As a result, highly warped semiconductor substrates may not be processed in some tools. Additionally, processing of highly warped semiconductor substrates may cause further warping. For example, etching of a trench in one direction can cause warping in asymmetric bowing due to asymmetric stress on the semiconductor substrate.

Some techniques exist for addressing symmetric bowing of semiconductor wafers, and in some cases, techniques can be used to reduce warpage by changing the process for fabricating the desired layers in the substrate. However, few techniques exist for compensating for asymmetric wafer warpage such as saddle-shaped bowing.

Provided herein are methods of processing bowed semiconductor substrates to mitigate bowing by depositing a bow compensation layer on the backside of the bowed semiconductor substrate by physical vapor deposition (PVD) to compensate for the bowing on the front side of the semiconductor substrate. For example, a compressive bow compensation layer is deposited on the backside of a bowed semiconductor substrate on regions having a compressive film on the front side of the semiconductor substrate and a tensile bow compensation layer is deposited on the backside of a bowed semiconductor substrate on regions having a tensile film on the front side of the semiconductor substrate. In various embodiments, films are deposited using a plasma formed in a process chamber sustained using a planar magnetron.

Backside deposition may be performed by inserting the semiconductor wafer into a PVD process chamber having a target and wafer holders to hold the wafer at a location spaced apart from the target such that the surface of the wafer to be deposited on faces the surface of the target. Processing may be performed by positioning the wafer such that the target can deposit material on particular regions of backside of the bowed semiconductor wafer. In some embodiments, the wafer is positioned such that the wafer is placed upright with the patterned regions facing up and the backside is on the bottom or facing downwards while the target is located below the wafer. In various embodiments, the backside of the wafer is flat and is not patterned. One or more targets may be used in certain disclosed embodiments.

In various embodiments, the target is an aluminum nitride target or a titanium nitride target. Certain disclosed embodiments are capable of depositing bow compensation layers to reduce the warpage of a semiconductor wafer from ±100 μm to ±500 μm.

In various embodiments described herein, process chambers for performing certain disclosed embodiments include a shadow mask to block certain regions of the wafer during deposition. The shadow mask may be positioned between the backside surface of the semiconductor substrate and the target. The shadow mask may have a thickness of about 1 mm. The shadow mask may be of any shape. In some embodiments, the shadow mask is made of a metal material, such as aluminum, or ceramic material, such as aluminum oxide (Al$_2$O$_3$). The shadow mask may be used to block some regions while leaving certain regions of the backside of the semiconductor substrate exposed. Exposed regions may be of any shape or size, up to the size of the wafer itself. In some embodiments, the shadow mask is cut from a flat circular shaped structure such that the regions the shadow mask can expose can be any shape or size. In some embodiments, the shadow mask is cut such that radially divided regions are cut radially from a region in the center of the circular shaped structure. The shadow mask may have radial segments anywhere between 1% and 100% the circular shaped structure; likewise, the shadow mask may be cut such that the cut out regions leave between 1% and 100% of the circular shaped structure. It will be understood that other shapes may be used as well, such as a flat disk with other shaped regions cut out from within the disk to expose regions of various shapes.

In some embodiments, these regions are quadrants such that two opposing quadrants are exposed and two opposing quadrants are made of the flat structure to block regions of the substrate. While a radially cut structure may be cut from the center of the circular shaped structure, in various embodiments the shadow mask is one continuous sheet such that the quadrants are cut from near but not exactly at the center of the circular shaped structure.

In some embodiments, the shadow mask includes two opposite quadrants which are used to prevent material from sputtering onto certain regions of the bowed semiconductor substrate. While quadrants may refer to one of four equally sized regions, quadrants described herein may also refer to regions smaller than four equally sized radially divided regions.

In various embodiments, the process chamber includes wafer aligning technology to align regions of the wafer with regions of the shadow mask. For example, a detector and motor can be used to align the wafer such that regions having tensile films are aligned with unblocked regions of the shadow mask so that the target can sputter a tensile film onto the backside of the substrate in regions where the front side of the substrate is tensile, and the target can sputter a compressive film on the backside of the substrate where the front side of the substrate is compressive. In some embodiments, the shadow mask is rotated to shift between depositing a compressive film and depositing a tensile film.

In some embodiments, a combinatorial PVD process is used in lieu of a shadow mask such that two targets are operated to deliver different materials onto different regions of the wafer. In such an embodiment, the wafer may be aligned depending on the locations of the targets in the chamber. Example chambers are further described below with respect to FIGS. 2A and 2B.

FIG. 1 is a process flow diagram showing operations performed in a method in accordance with certain disclosed embodiments. In operation 102, a bowed semiconductor substrate is provided to a PVD process chamber equipped with a metal target, such as an aluminum target. The substrate may be a silicon wafer, e.g., a 200-mm wafer, a 300-mm wafer, or a 450-mm wafer, including wafers having one or more layers of material, such as dielectric, conducting, or semi-conducting material deposited thereon. Some of the one or more layers may be patterned. Non-limiting examples of layers include dielectric layers and conducting layers, e.g., silicon oxides, silicon nitrides, silicon carbides, metal oxides, metal nitrides, metal carbides, and metal layers. In various embodiments, the substrate is patterned.

In some embodiments, the semiconductor substrate includes a patterned 3D-NAND structure and one or more etched trenches in the substrate.

The bowed semiconductor substrate prior to deposition of a bow compensation layer may have a warpage of about ±1000 µm. In some embodiments, the bowed semiconductor substrate has a warpage greater than ±300 µm and less than about ±1000 µm. The warpage is defined as the distance from the lowest point of the wafer to the highest point of the wafer. In some embodiments, the bowed semiconductor substrate has symmetric bowing. In some embodiments, the bowed semiconductor substrate has asymmetrical bowing as described above. In some embodiments, the bowed semiconductor substrate is saddle-shaped. In various embodiments, the bowed semiconductor substrate includes at least one tensile region and one compressive region.

As discussed above, an asymmetrically warped or bowed wafer can have two different x-axis and y-axis warpages. For example, in one example wafer, the x-axis warpage may be −50 µm and the y-axis warpage may be −300 µm. Compensating this type of asymmetric wafer bowing can be performed by depositing films of different stress for the high bow and low bow regions. For example, in some embodiments, a region with −50 µm warpage can be compensated with a −50 MPa stress silicon oxide film, while a region with −300 µm warpage can be compensated with a −300 MPa stress silicon oxide film.

The substrate is provided to a process chamber having a wafer holder and one or more targets for delivering material to the underside of the semiconductor substrate. In some embodiments, the process chamber includes a shadow mask between the target and the backside of the wafer holder. The shadow mask may be set at any suitable distance from the backside of the semiconductor wafer. The position of the shadow mask may depend on the hardware used. In some embodiments, the shadow mask may be set at a distance between about 1 mm and about 1 cm from a surface of a semiconductor wafer as measured from the surface of the shadow mask to the closest point of the bowed semiconductor wafer. The shadow mask may be shaped with cutouts such that cutout regions expose regions of the backside of the semiconductor substrate and regions blocked by the shadow mask block deposition onto other regions of the backside of the semiconductor substrate.

In operation 104, the bowed semiconductor substrate is aligned. In various embodiments, for an asymmetrically bowed semiconductor substrate, aligning is performed by determining which regions of the bowed semiconductor substrate have the pivot points between curving up and curving down on the substrate such that the pivot points align with certain targets in a combinatorial PVD process. Alignment can be performed by using a wafer aligned based on laser scan of a notch position and can be aligned to ±1 degree accuracy.

In operation 106, a bow compensation layer is deposited on the backside of the bowed semiconductor substrate to mitigate bowing of the semiconductor substrate. In various embodiments, operation 106 involves forming a tensile film on the backside of the substrate where the front side is tensile. In some embodiments, operation 106 involves forming compressive films on the backside of the substrate where the front side is compressive.

In one embodiment, the bow compensation layer is deposited in a one-step process of using a combinatorial PVD process. In some embodiments, operation 106 may involve more than one operation of deposition and may include, in some embodiments, rotating the semiconductor substrate, rotating a shadow mask, or both between depositions in a multi-step process.

The bow compensation layer composition depends on the wafer it is being deposited on and can include multiple compositions. For example, the bow compensation layer includes a compressive film when deposited on a region of the wafer where the front side is compressive, or includes a tensile film when deposited on a region of a wafer where the front side is tensile, or both. The bow compensation layer may include multiple tensile regions of the bow compensation layer deposited on multiple tensile regions of a wafer as well as multiple compressive regions of the bow compensation layer deposited on multiple compressive regions of the wafer.

Example materials for a compressive film to be deposited on the backside of the wafer include silicon oxide, silicon nitride, silicon, and carbon. The selection of targets and process conditions can be used to tune the stress of the bow compensation layer.

In various embodiments, a compressive film may be a compressive silicon oxide film or a compressive silicon nitride film. In various embodiments, a compressive film may be a compressive silicon oxide film. In various embodiments, a tensile film may be a tensile silicon nitride film or a tensile silicon oxide film.

"Silicon oxide" is referred to herein as including chemical compounds including silicon and oxygen atoms, including any and all stoichiometric possibilities for $Si_xO_y$, including integer values of x and y and non-integer values of x and y. For example, "silicon oxide" includes compounds having the formula $SiO_n$, where $1 \leq n \leq 2$, where n can be an integer or non-integer values. "Silicon oxide" can include sub-stoichiometric compounds such as $SiO_{1.8}$. "Silicon oxide" also includes silicon dioxide ($SiO_2$) and silicon monoxide (SiO). "Silicon oxide" also includes both natural and synthetic variations and also includes any and all crystalline and molecular structures, including tetrahedral coordination of oxygen atoms surrounding a central silicon atom. "Silicon oxide" also includes amorphous silicon oxide and silicates.

"Silicon nitride" is referred to herein as including any and all stoichiometric possibilities for $Si_xN_y$, including integer values of x and y and non-integer values of x and y, such as x=3 and y=4. For example, "silicon nitride" includes compounds having the formula $SiN_n$, where $1 \leq n \leq 2$, where n can be an integer or non-integer values. "Silicon nitride" can include sub-stoichiometric compounds such as $SiN_{1.8}$. "Silicon nitride" also includes $Si_3N_4$ and silicon nitride with trace and/or interstitial hydrogen (SiNH) and silicon nitride with trace amounts of and/or interstitial oxygen (SiON). "Silicon nitride" also includes both natural and synthetic variations and also includes any and all lattice, crystalline, and molecular structures, including trigonal alpha-silicon nitride, hexagonal beta-silicon nitride, and cubic gamma-silicon nitride. "Silicon nitride" also includes amorphous silicon nitride and can include silicon nitride having trace amounts of impurities.

In some embodiments, a silicon oxide film may be deposited using a chamber pressure of 2.2e-04 Torr at 200° C. for deposition at a deposition rate of 0.5 nm/second to form a neutral stress silicon oxide film, whereas using a chamber pressure one tenth of the pressure recited above can result in a silicon oxide film having a compressive stress of −400 MPa.

For deposition of nitride films, in some embodiments a gas mixture of about 10% nitrogen gas and 90% argon gas may be used during deposition. An example set of process conditions for sputtering aluminum nitride may include a target current between 70 mA and 130 mA, and a target voltage between 700 V DC and 1300 V DC with a coil current between 1A and 5 A and substrate bias voltage between 0V and 250V. In some embodiments, the sputtering pressure is between 0.1 Pa and 0.5 Pa. In some embodiments, varying the bias voltage during sputtering may be used to modulate stress. For example, compressive stress of an aluminum nitride film may increase between increasing a bias voltage between 0V and 50V, and compressive stress of an aluminum nitride film may decrease as substrate bias voltage is increased from 50V to 200V. Such an example is described in Bassam Abdallah et al., *Deposition of AlN films by reactive sputtering: Effective of radio frequency substrate bias*, 515 THIN SOLID FILMS 7104, 7106 (2007).

In some embodiments, for depositing silicon oxide, the background pressure may be about 10e-05 Torr. In some embodiments, silicon oxide deposited by PVD with this pressure and particular temperature and deposition rate is compressive.

Process conditions including pressure and bias voltage, both of which are provided here as examples, can be used to modulate the stress of sputtered films. Such process conditions include temperature, pressure, presence of gases in the chamber, sputter substrate bias voltage, plasma conditions, target composition, and other suitable process conditions. It will be understood that the process conditions disclosed herein are provided only as examples and other suitable process conditions may be used to deposit compressive and tensile films as desired to compensate for wafer bowing.

An example for sputtering material in quadrants using a shadow mask is further described below with respect to FIG. 2B. An example for sputtering material using combinatorial PVD is further described below with respect to FIG. 3B.

In some embodiments, materials may be deposited using two or more operations of PVD, which involves rotating the shadow mask between depositions to deposit material in the desired regions. Materials deposited in each set of opposite regions may be the same or different between sets.

In one example, aluminum nitride is deposited to regions 201 and 203 while regions 202 and 204 are shielded; the shadow mask is rotated; and titanium nitride is deposited to regions 202 and 204 while regions 201 and 203 are shielded.

In various embodiments, a purge gas may be optionally introduced to flush the environment but may not be used in some embodiments as deposition by sputtering has little to no chance of being deposited on the front side of the wafer.

The number of layers and/or the thickness of the films deposited in a bow compensation layer can also affect the warpage of the film. Bow of different asymmetrical features of the wafer may be compensated using different layers and bow compensation layers may be deposited at various stages of semiconductor fabrication. For example, to achieve a bow change of between about −200 μm and about −300 μm (such as to change a wafer having a warpage of +1000 μm to +800 μm (a change of −200 μm)), a film can be deposited to a thickness between 10000 Å and 15000 Å to achieve the desired bow change. Likewise, to achieve a bow change of between about +200 μm and about +300 μm (such as to change a wafer having a warpage of −400 μm to −200 μm (a change of −200 μm)), a film can be deposited to a thickness between 6000 Å and about 10000 Å to achieve the desired bow change.

Compensation for different wafer bowing may be used at different steps of a particular process flow. In some embodiments, different bow compensation layers having different stress and materials may be used to compensate for symmetrically bowed or saddle shaped wafers.

In some embodiments, the bow compensation layer may be removable. For example, after the bow compensation layer is deposited, the wafer may be transferred to another process chamber for additional processing such as lithography, deposition, etching, or other operations. Following these operations, the wafer may be warped and the bow compensation layer on the backside may be removed such that another bow compensation layer may be deposited to reduce warping of the wafer. In some embodiments, additional bow compensation layer may be deposited over an existing bow compensation layer to reduce warping such that bow compensation layers are ultimately removed in further downstream processing operations. In some embodiments, bow compensation layers are very thin and may not be removed at all.

In some embodiments, gases may be used in a PVD chamber to interact with material from the target. For example, a silicon target may be used with oxygen gas to form a silicon oxide film. In some embodiments, a silicon target may be used with nitrogen gas to form a silicon nitride film. The amount of gas and the amount of sputtering can be used to modulate the stress of the film and be changed to deposit either a compressive or tensile film as desired.

The spatial growth of different materials on the backside of the semiconductor wafer is defined by either the shadow mask or by different targets being used, or both.

If the wafer is warped in such a way that the focal point of warpage is not at the center of the wafer, various different shadow masks can be used. Different shadow masks can be loaded to accommodate for different wafer bow compensation without breaking vacuum.

Intermediate mixing regions can be achieved by sputtering two different materials onto the substrate where the field of sputtering species overlaps on a surface of the backside of a substrate. Various numbers of targets may be used for sputtering on a single substrate. For example, between and including 1 and 5 targets may be used in some embodiments.

Apparatus

Disclosed embodiments may be performed in any suitable apparatus or tool. An apparatus or tool may include one or more process stations. Described below are an example process station and tool that may be used in some embodiments.

Figure 4:
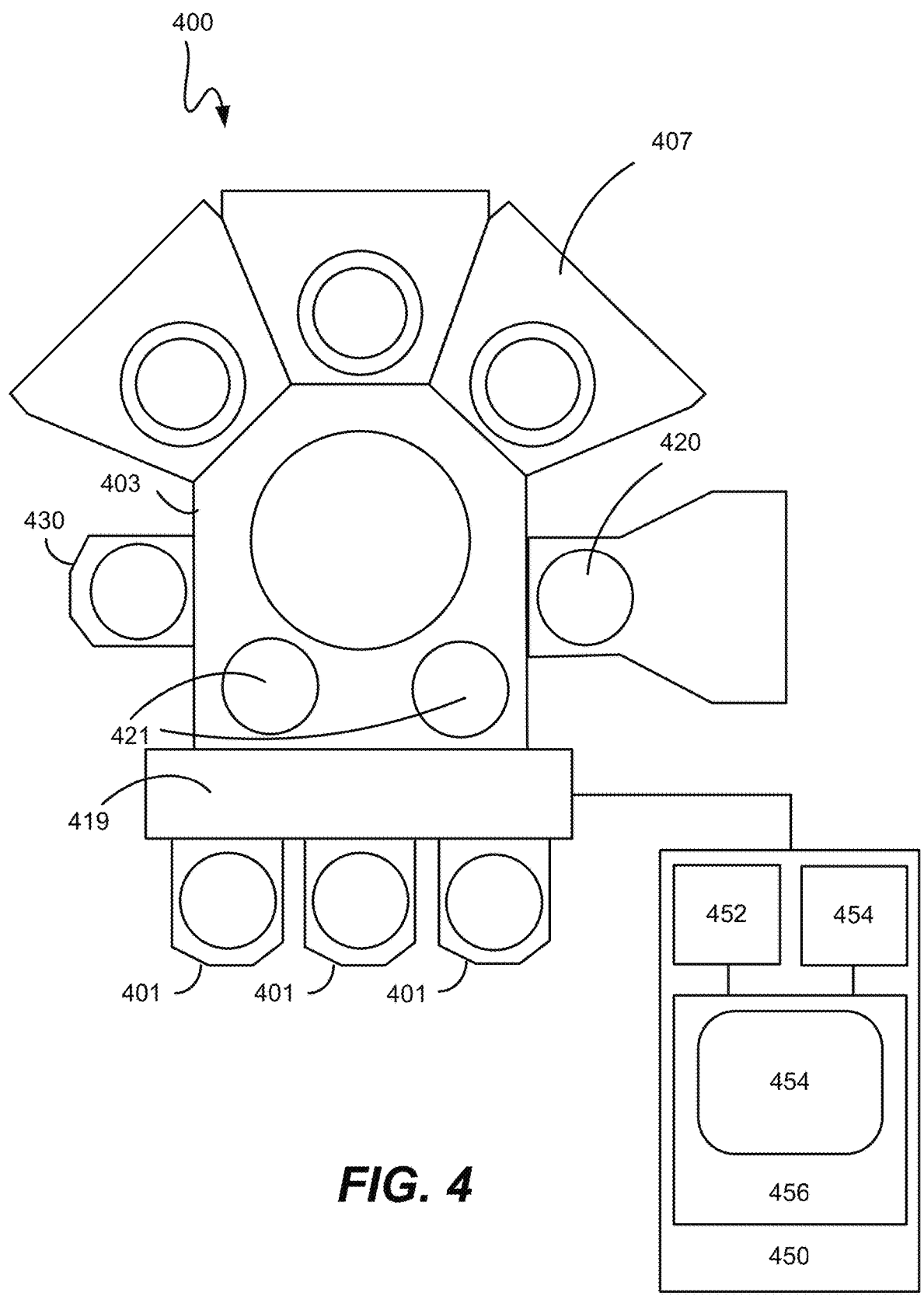
FIG. 4 is a schematic diagram of an example process tool for performing disclosed embodiments.

FIG. 2A depicts a schematic illustration of an embodiment of physical vapor deposition (PVD) process station 200 having a process chamber body 202. A plurality of PVD process stations 200 may be included in a multi-station processing tool, such as shown in FIG. 4. In some embodiments, one or more hardware parameters of PVD process station 200, including those discussed in detail below, may be adjusted programmatically by one or more computer controllers 250. Target 207, a circular, planar block of material, is spaced from the wafer 203, which is held by wafer holders 201 in chamber 200. A DC power supply (not shown) is used to apply a DC field to target 207, establishing a plasma in the chamber between target 207 and wafer 203. A circular magnet 210 mounted above the target is rotated by motor (not shown) setting up a magnetic field extending through target 207 into the region between the target 207 and wafer 203. A shadow mask 205 is positioned between wafer 203 and target 207 to shadow mask regions of wafer 203 during sputtering from target 207. A top view of the chamber is shown in FIG. 2B, which shows wafer holders 201, wafer 203 and, for purposes of illustration, the wafer 203 is depicted as being transparent to show the shadow mask 205 underlying the wafer 203 such that only top right and bottom left quadrants are exposed to the sputtering species.

Returning to FIG. 2A, cryopump (not shown) connected to chamber 200 via valve (not shown) is used to evacuate the chamber 200. Process gas injector (not shown) is connected to process gas supply via mass flow controller (not shown). A sputtering gas is introduced into chamber 200 via injectors.

The methods of present invention may be practiced in other types of planar magnetrons, such as ones having ICP sources. It is noted that the methods of present invention do not require the presence of an RF-biased coil within the apparatus, although they can be practiced in an apparatus equipped with such coil. In other embodiments an electromagnetic coil or coils rather than a rotating magnet can be used to maintain the plasma. The apparatus will also typically include a controller 250 electrically connected to the apparatus and containing a set of program instructions or built-in logic for executing any of the described deposition processes.

In certain embodiments, the system controller is employed to control process conditions during deposition, insert and remove wafers, etc. The controller will typically include one or more memory devices and one or more processors. The processor may include a CPU or computer, analog and/or digital input/output connections, stepper motor controller boards, etc.

Figure 3B:
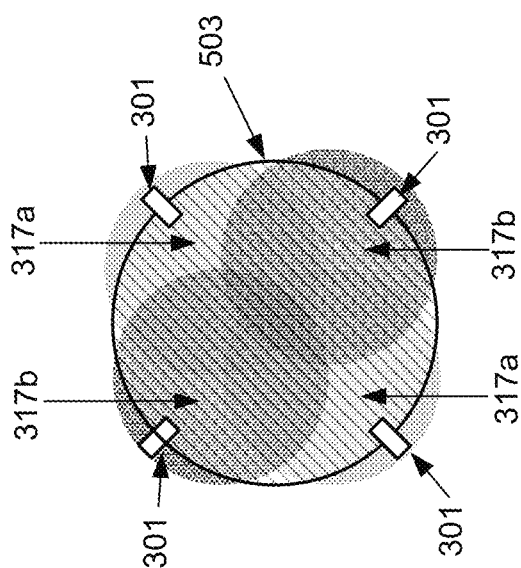
FIG. 3B is a top view of the wafer and sputtering regions in FIG. 3A.
Figure 3A:
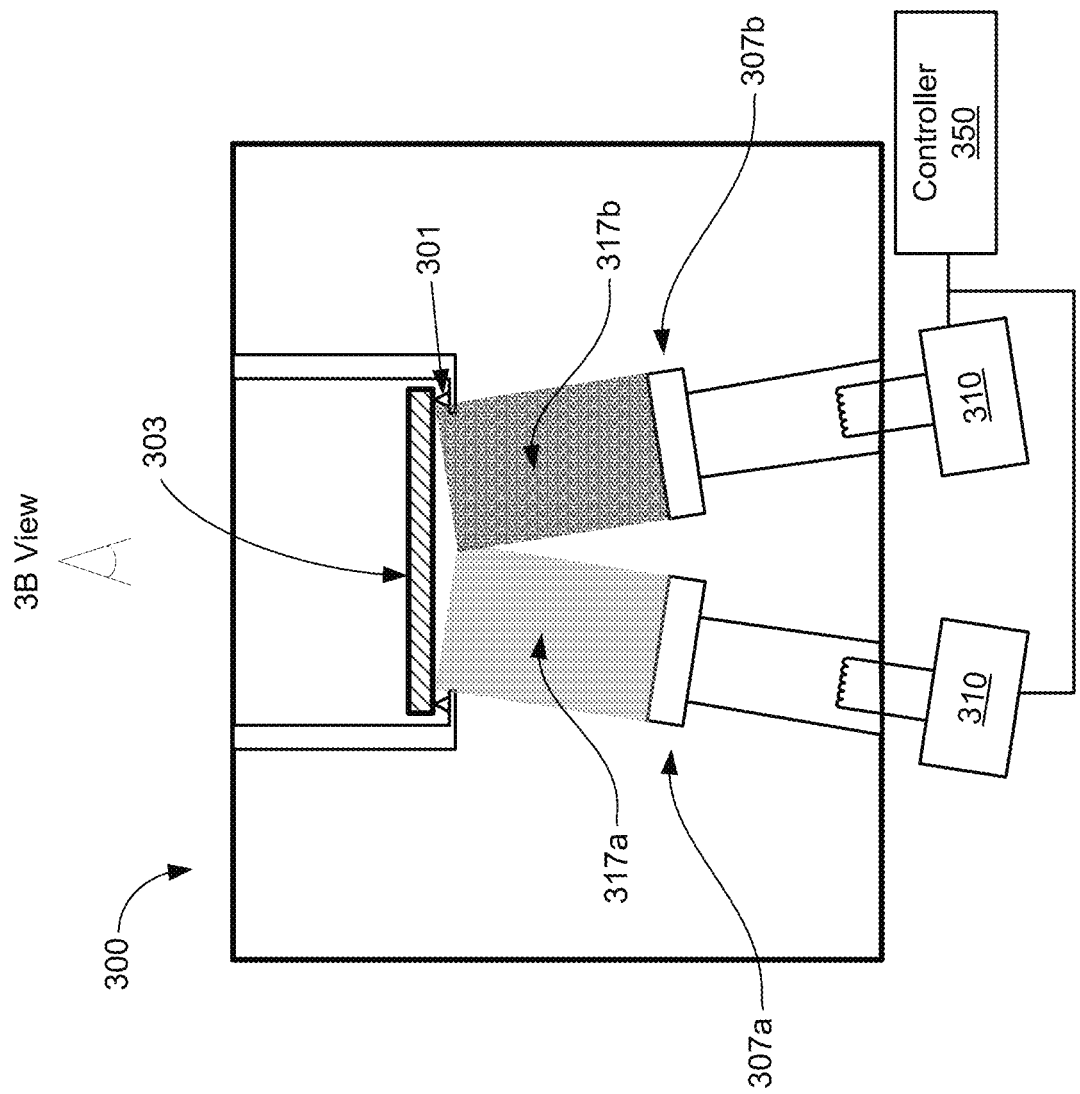
FIG. 3A is a schematic diagram of an example process station for performing disclosed embodiments.

FIG. 3A shows another depicts a schematic illustration of an embodiment of physical vapor deposition (PVD) process station 300 having a process chamber 302. A plurality of PVD process stations 300 may be included in a multi-station processing tool, such as shown in FIG. 4. In some embodiments, one or more hardware parameters of PVD process station 300, including those discussed in detail below, may be adjusted programmatically by one or more computer controllers 350. Targets 307a and 307b, which are circular, planar blocks of material, are spaced from the wafer 303, which is held by wafer holders 301 in chamber 300. As shown in this example, the use of two targets 307a and 307b results in sputtering areas 317a and 317b that can ultimately overlap on the surface of wafer 303. In some cases, the target diameters are small such that the wafer 303 can be exposed to a first sputtering using the two targets 307a and 307b, rotated by 180° using the wafer holders 301, and exposed to a second sputtering using the same two targets 307a and 307b, resulting in overlapping combinatorial PVD such as shown in FIG. 3B, which depicts regions 317b deposited using target 317b, and regions 317a deposited using target 317a as a top view of the wafer 303 whereby the wafer 303 is shown as being transparent to show the different deposited regions.

A DC power supply (not shown) is used to apply a DC field to targets 307a and 307b, establishing a plasma in the chamber between targets 307a and 307b and wafer 303. A circular magnet 310 mounted above the targets 307a and 307b is rotated by motor (not shown) setting up a magnetic field extending through targets 307a and 307b into the region between the targets 307a and 307b and wafer 303. An optional shadow mask (not shown) could be positioned between wafer 303 and targets 307a and 307b to shadow mask regions of wafer 303 during sputtering from targets 307a and 307b. A top view of the chamber is shown in FIG. 3B, which shows wafer holders 301, wafer 303, and, for purposes of illustration, the wafer 303 is depicted as being transparent to show the regions 317a and 317b underlying the wafer 303 for a combinatorial PVD embodiment.

Returning to FIG. 3A, cryopump (not shown) connected to chamber 300 via valve (not shown) is used to evacuate the chamber 300. Process gas injector (not shown) is connected to process gas supply via mass flow controller (not shown). A sputtering gas is introduced into chamber 300 via injectors.

The methods of present invention may be practiced in other types of planar magnetrons, such as ones having ICP sources. It is noted that the methods of present invention do not require the presence of an RF-biased coil within the apparatus, although they can be practiced in an apparatus equipped with such coil. In other embodiments an electromagnetic coil or coils rather than a rotating magnet can be used to maintain the plasma. The apparatus will also typically include a controller 350 electrically connected to the apparatus and containing a set of program instructions or built-in logic for executing any of the described deposition processes.

In certain embodiments, the system controller is employed to control process conditions during deposition, insert and remove wafers, etc. The controller will typically include one or more memory devices and one or more processors. The processor may include a CPU or computer, analog and/or digital input/output connections, stepper motor controller boards, etc.

As described above, one or more process stations may be included in a multi-station processing tool. FIG. 4 shows a schematic view of an embodiment of a multi-station processing tool 400 with an inbound load lock 421 which may include a remote plasma source. A robot 403, at atmospheric pressure, is configured to move wafers from a cassette loaded through a pod 401 into inbound load lock 421 via wafer transfer system 419. A wafer or substrate is placed by the robot 403 on a pedestal in one of the stations 407, the atmospheric port (not shown) is closed, and the load lock is pumped down. At least one of the stations 407 is used to deposit material onto a backside of a wafer by PVD. Where the inbound load lock 401 includes a remote plasma source, the wafer may be exposed to a remote plasma treatment in the load lock prior to being introduced into a processing chamber 407. The tool may also include additional modules 430 and 420 for other processing operations. Further, the wafer also may be heated in the inbound load lock 421 or in pods 401 as well, for example, to remove moisture and adsorbed gases. Next, a chamber transport port (not shown) to processing chamber 407 is opened, and another robot (not shown) places the wafer into the reactor on a pedestal of another station in the reactor for processing. While the embodiment depicted in FIG. 4 includes load locks, it will be appreciated that, in some embodiments, direct entry of a wafer into a process station may be provided.

The depicted processing tool 400 includes three process stations, as shown in the embodiment shown in FIG. 4. Each of the stations 407 has a heated pedestal, and gas line inlets. It will be appreciated that in some embodiments, each process station may have different or multiple purposes. While the depicted processing chamber tool includes three stations, it will be understood that a processing chamber according to the present disclosure may have any suitable number of stations. For example, in some embodiments, a processing chamber may have five or more stations, while in other embodiments a processing chamber may have three or fewer stations.

FIG. 4 depicts an embodiment of a wafer handling system 403 for transferring wafers within processing tool 400. In some embodiments, wafer handling system 490 may transfer wafers between various process stations and/or between a process station and a load lock. It will be appreciated that any suitable wafer handling system may be employed. Non-limiting examples include wafer carousels and wafer handling robots.

FIG. 4 also depicts an embodiment of a system controller 450 employed to control process conditions and hardware states of process tool 400. System controller 450 may include one or more memory devices 456, one or more mass storage devices 454, and one or more processors 452. Processor 452 may include a CPU or computer, analog and/or digital input/output connections, stepper motor controller boards, etc.

In some embodiments, system controller 450 controls all of the activities of process tool 400. System controller 450 executes system control software 458 stored in mass storage device 454, loaded into memory device 456, and executed on processor 452. Alternatively, the control logic may be hard coded in the controller 450. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 358 may include instructions for controlling the transfer of wafers into and out of a process chamber, rotating wafers within a process chamber, aligning wafers in a process chamber, transfer of wafers into and out of a process chamber, timing of generation of sputtering species and magnetic fields for sputtering material, amount of gas flow, chamber and/or station pressure, chamber and/or reactor temperature, wafer temperature, target power levels, RF power levels and type (such as single frequency or dual frequency or high frequency or low frequency), pedestal, chuck and/or susceptor position, and other parameters of a particular process performed by process tool 400. System control software 458 may be configured in any suitable way. For example, various process tool component subroutines or control objects may be written to control operation of the process tool components used to carry out various process tool processes. System control software 458 may be coded in any suitable computer readable programming language.

In some embodiments, system control software 458 may include input/output control (IOC) sequencing instructions for controlling the various parameters described above. Other computer software and/or programs stored on mass storage device 454 and/or memory device 456 associated with system controller 450 may be employed in some embodiments. Examples of programs or sections of programs for this purpose include a substrate positioning program, a process gas control program, a pressure control program, a heater control program, electrostatic chuck power control program, and a plasma control program.

A substrate positioning program may include program code for process tool components that are used to load the substrate onto pedestal 418 and to control the spacing between the substrate and other parts of process tool 400. A bias and plasma control program may include code for controlling plasma and bias power for sputtering material from a target onto the backside of a semiconductor wafer in the process station. A process gas control program may include code for controlling gas composition and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, pressure of gas introduced to backside of a wafer during conditioning operations, etc.

A heater control program may include code for controlling the current to a heating unit that is used to heat the substrate. Alternatively, the heater control program may control delivery of a heat transfer gas (such as helium) to the substrate. A plasma control program may include code for setting RF power levels applied to the process electrodes in one or more process stations in accordance with the embodiments herein. A pressure control program may include code for maintaining the pressure in the reaction chamber in accordance with the embodiments herein.

In some embodiments, there may be a user interface associated with system controller 450. The user interface may include a display screen, graphical software displays of the apparatus and/or process conditions, and user input devices such as pointing devices, keyboards, touch screens, microphones, etc.

In some embodiments, parameters adjusted by system controller 450 may relate to process conditions. Non-limiting examples include process gas composition and flow rates, temperature, pressure, plasma conditions (such as DC power levels), etc. These parameters may be provided to the user in the form of a recipe, which may be entered utilizing the user interface.

Signals for monitoring the process may be provided by analog and/or digital input connections of system controller 450 from various process tool sensors. The signals for controlling the process may be output on the analog and digital output connections of process tool 400. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 450 may provide program instructions for implementing the above described deposition processes. The program instructions may control a variety of process parameters, such as DC power level, RF bias power level, pressure, temperature, etc. The instructions may control the parameters to operate in-situ deposition of films according to various embodiments described herein.

The system controller 450 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 450.

In some implementations, the system controller 450 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 450, depending on the processing conditions and/or the type of system, may be programmed to control any of the processes disclosed herein, including the delivery of processing gases and/or inhibitor gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 450 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 450 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 450, in some implementations, may be a part of or coupled to a computer that is integrated with, coupled to the system, otherwise networked to the system, or a combination thereof. For example, the system controller 450 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 450 receives instructions in the form of data, which specify parameters for each of the processing steps to be performed during one or more operations. It should be understood that the parameters may be specific to the type of process to be performed and the type of tool that the system controller 450 is configured to interface with or control. Thus as described above, the system controller 450 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a CVD or PECVD chamber or module, an ALD or PEALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 450 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
providing a bowed semiconductor substrate having a first tensile region and a first compressive region;
aligning the bowed semiconductor substrate such that the first tensile region and the first compressive region are aligned with a target for sputtering a second tensile region and a second compressive region, respectively, to a backside of the bowed semiconductor substrate; and mitigating bowing of the bowed semiconductor substrate by sputtering a bow compensation layer on the backside of the bowed semiconductor substrate by physical vapor deposition, the bow compensation layer comprising the second tensile region and the second compressive region.

2. The method of claim 1, wherein the bowed semiconductor substrate after mitigating bowing has a warpage between −500 µm and +500 µm.

3. The method of claim 1, wherein the bowed semiconductor substrate is bowed up to about 500 µm as measured from a lowest point of the bowed semiconductor substrate to a highest point of the bowed semiconductor substrate prior to sputtering the bow compensation layer.

4. The method of claim 1, wherein the bowed semiconductor substrate is saddle-shaped prior to sputtering the bow compensation layer.

5. The method of claim 1, wherein the bowed semiconductor substrate has an x-axis bowing of greater than 200 µm and a y-axis bowing greater than 200 µm prior to sputtering the bow compensation layer, and wherein either the x-axis bowing or the y-axis bowing is negative and the other is positive.

6. The method of claim 1, wherein the second tensile region is deposited on the first tensile region of the backside of the bowed semiconductor substrate.

7. The method of claim 6, wherein the second tensile region comprises aluminum nitride deposited using an aluminum-containing target.

8. The method of claim 1, wherein the second compressive region is deposited on the first compressive region of the backside of the bowed semiconductor substrate.

9. The method of claim 7, wherein the second compressive region comprises titanium nitride deposited using a titanium-containing target.

10. The method of claim 1, wherein the second tensile region and second compressive region of the bow compensation layer are on alternating quadrants of the bow compensation layer.

11. The method of claim 1, wherein the bow compensation layer is deposited in two or more separate operations.

12. The method of claim 11, wherein the two or more separate operations comprise an operation for deposition of the second tensile region of the bow compensation layer and an operation for deposition of the second compressive region of the bow compensation layer.

13. The method of claim 1, wherein the second compressive region comprises carbon.

14. The method of claim 1, wherein the second compressive region comprises silicon.

15. The method of claim 1, wherein the bow compensation layer comprises two or more compositions.

16. The method of claim 1, further comprising flowing a process gas during the mitigating bowing of the bowed semiconductor substrate.

17. The method of claim 1, wherein the bow compensation layer comprises aluminum nitride, titanium nitride, or both.

18. The method of claim 1, wherein the second tensile region and the second compressive region of the bow compensation layer deposited in opposite quadrants have different compositions.

* * * * *